United States Patent
Gupta et al.

(10) Patent No.: US 11,734,480 B2
(45) Date of Patent: Aug. 22, 2023

(54) PERFORMANCE MODELING AND ANALYSIS OF MICROPROCESSORS USING DEPENDENCY GRAPHS

(71) Applicant: Microsoft Technology Licensing, LLC, Redmond, WA (US)

(72) Inventors: Gagan Gupta, Bellevue, WA (US); Rathijit Sen, Madison, WI (US); Hossein Golestani, Ann Arbor, MI (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 538 days.

(21) Appl. No.: 16/224,718

(22) Filed: Dec. 18, 2018

(65) Prior Publication Data

US 2020/0192994 A1 Jun. 18, 2020

(51) Int. Cl.
  *G06F 30/30* (2020.01)
  *G06F 11/34* (2006.01)

(52) U.S. Cl.
  CPC .......... *G06F 30/30* (2020.01); *G06F 11/3447* (2013.01); *G06F 11/3466* (2013.01)

(58) Field of Classification Search
  CPC .......... G06F 30/30; G06F 30/31; G06F 30/34; G06F 30/36; G06F 11/3447; G06F 11/3466

(Continued)

(56) References Cited

U.S. PATENT DOCUMENTS

| | | | |
|---|---|---|---|
| 5,712,791 A | * | 1/1998 | Lauterbach ............. G06F 30/30 716/136 |
| 6,067,412 A | | 5/2000 | Blake et al. |

(Continued)

FOREIGN PATENT DOCUMENTS

CN 101427223 A 5/2009

OTHER PUBLICATIONS

La Fratta et al. (Non-Patented Literature, "Optimizing the Internal Microarchitecture and ISA of a Traveling Thread Pim System") (Year: 2010).*

(Continued)

*Primary Examiner* — John E Johansen
(74) *Attorney, Agent, or Firm* — Weaver IP L.L.C.

(57) ABSTRACT

Embodiments described herein are directed to a microarchitecture modeling tool configured to model and analyze a microarchitecture using a dependency graph. The dependency graph may be generated based on an execution trace of a program and a microarchitecture definition that specifies various features and/or characteristics of the microarchitecture on which the execution trace is based. The dependency graph includes vertices representing different microarchitectural events. The vertices are coupled via edges representing a particular dependency therebetween. The edges are associated with a cost for performing microarchitectural event(s) corresponding to the vertices coupled thereto. The dependency graph also takes into account various policies for structural hazards of the microarchitecture. The microarchitecture modeling tool analyzes the costs associated with each of the edges to determine a design metric of the microarchitecture. A user is enabled to modify various features of the dependency graph to analyze different design choices and/or optimizations to the microarchitecture.

20 Claims, 8 Drawing Sheets

(58) Field of Classification Search
USPC .......................................................... 703/21
See application file for complete search history.

(56) References Cited

U.S. PATENT DOCUMENTS

| | | | |
|---|---|---|---|
| 7,904,892 B2* | 3/2011 | Babb, II ................... | G06F 8/75 |
| | | | 717/133 |
| 10,521,197 B1* | 12/2019 | Ciolfi ...................... | G06F 30/20 |
| 2003/0171907 A1 | 9/2003 | Gal-On et al. | |
| 2004/0003384 A1 | 1/2004 | Pechtchanski et al. | |
| 2004/0205726 A1* | 10/2004 | Chedgey .................. | G06F 8/75 |
| | | | 717/125 |
| 2005/0273310 A1 | 12/2005 | Newburn | |
| 2006/0031823 A1* | 2/2006 | Vasilevskiy ............. | G06F 8/445 |
| | | | 717/144 |
| 2011/0145035 A1* | 6/2011 | Franke ................. | G06Q 10/067 |
| | | | 705/7.22 |
| 2013/0125097 A1* | 5/2013 | Ebcioglu ............... | G06F 8/4452 |
| | | | 717/136 |
| 2014/0006001 A1 | 1/2014 | Kamhi et al. | |
| 2015/0082263 A1* | 3/2015 | Vasudevan .......... | G06F 30/3323 |
| | | | 716/106 |
| 2015/0154330 A1* | 6/2015 | Yachide .................. | G06F 30/33 |
| | | | 716/102 |
| 2015/0339209 A1 | 11/2015 | Kerr et al. | |
| 2017/0364429 A1 | 12/2017 | Funk et al. | |
| 2017/0371836 A1* | 12/2017 | Langhammer ... | H03K 19/17704 |
| 2018/0046441 A1* | 2/2018 | Su ........................... | G06F 8/433 |
| 2018/0232235 A1* | 8/2018 | Gaur ........................ | G06F 8/41 |

OTHER PUBLICATIONS

Fields et al. (Non-Patented Literature, "Focusing Processor Policies via Critical-Path Prediction") (Year: 2002).*
Copty et al. (Non-Patented Literature, "Transaction Level Statistical Analysis for Efficient Micro-Architectural Power and Performance Studies") (Year: 2011).*
Yan (Non-Patented Literature, "The iDEA Architecture-Focused FPGA Soft Processor") (Year: 2016).*
Dreesen et al. (Non-Patented Literature, "Dependence Analysis of VLIW Code for Non-Interlocked Pipelines") (Year: 2010).*
Tournavitis et al. (Non-Patented Literature, "Semi-Automatic Extraction and Exploitation of Hierarchical Pipeline Parallelism Using Profiling Information") (Year: 2010).*
Jan Malburg et al., "Debugging hardware designs using dynamic dependency graphs," 2016, Microprocessors and Microsystems, vol. 47, pp. 347-359 (Year: 2016).*
Craeynest, et al., "Understanding Fundamental Design Choices in Single-ISA Heterogeneous Multicore Architectures", In Journal of ACM Transactions on Architecture and Code Optimization, vol. 9, Issue 4, Jan. 2013, 23 Pages.
Fields, et al., "Using Interaction Costs for Microarchitectural Bottleneck Analysis", In Proceedings of 36th Annual IEEE/ACM International Symposium on Microarchitecture, Dec. 3, 2003, 12 Pages.
Kranzlmuller, Dieter, "Event Graph Analysis for Debugging Massively Parallel Programs", In Dissertation of Johannes Kepler University, Sep. 2000, 344 PAges.
Kwok, et al., "Static scheduling algorithms for allocating directed task graphs to multiprocessors", In Journal of ACM Computing Surveys, vol. 31, Issue 4, Dec. 1999, pp. 406-471.
Mutlu, Onur, "Fundamental Concepts and ISA", Retrieved from: https://www.ethz.ch/content/dam/ethz/special-interest/infk/inst-infsec/system-security-group-dam/education/Digitaltechnik_17/lecture/onur-DigitalDesign-2017-lecture13-multi-cycle-afterlecture.pdf, Apr. 6, 2017, 96 Pages.
Nagarajan, et al., "Critical Path Analysis of the TRIPS Architecture", In Proceedings of IEEE International Symposium on Performance Analysis of Systems and Software, Mar. 19, 2006, 11 Pages.
Robatmili, et al., "Exploiting Criticality to Reduce Bottlenecks in Distributed Uniprocessors", In Proceedings of IEEE 17th International Symposium on High Performance Computer Architecture, Feb. 12, 2011, 12 Pages.
Trubiani, et al., "Exploring Synergies between Bottleneck Analysis and Performance Antipatterns", In Proceedings of 5th ACM/SPEC International Conference on Performance Engineering, Mar. 22, 2014, pp. 75-86.
Wall, David W., "Limits of instruction-level parallelism", In WRL Research Report 93/6, Nov. 1993, 73 Pages.
Ye, et al., "Analyzing & Modeling the Performance in Xen-based Virtual Cluster Environment", In Proceedings of 12th IEEE International Conference on High Performance Computing and Communications, Sep. 1, 2010, pp. 273-280.
"International Search Report and Written Opinion Issued in PCT Application No. PCT/US2019/064799", dated Mar. 16, 2020, 17 Pages.

* cited by examiner

PERFORMANCE MODELING AND ANALYSIS OF MICROPROCESSORS USING DEPENDENCY GRAPHS

BACKGROUND

Designing modern processors entails exploring a range of techniques whose benefits are not always obvious because of their complex interactions with each other and other components in the design. Implementing the techniques can be non-trivial and time consuming, making this approach non-practical during design exploration. Hence, modeling methods based on simulators are used to model techniques to evaluate them. Although simpler to implement than actual implementation, simulating designs via simulators can be very time consuming, making this approach less than ideal. Moreover, such techniques do not effectively model a microarchitecture holistically, thereby making it difficult for engineers to easily determine system bottlenecks and other limitations. Therefore, effective implementation changes for an improved microarchitecture design are more difficult to realize.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments described herein are directed to a microarchitecture modeling tool that is configured to model and analyze a microarchitecture using a dependency graph. The dependency graph may be automatically generated based on an execution trace of a program and a microarchitecture definition that specifies various features and/or characteristics of the microarchitecture on which the execution trace is based. The dependency graph includes a plurality of vertices, each vertex representing a particular microarchitectural event that occurred during execution of the program, and a plurality of edges that couple the plurality of vertices. Each edge represents a particular dependency (e.g., a data or control dependency) between the microarchitectural events represented by the coupled vertices. Each of the edges may be associated with a cost for performing a corresponding microarchitectural event (e.g., a latency or number of clock cycles required to perform microarchitectural events corresponding to the vertices coupled thereto). The dependency graph may also take into account various policies for structural hazards of the microarchitecture. The microarchitecture modeling tool analyzes the costs associated with each of the edges to determine a design metric of the microarchitecture. A user may be enabled to modify various features of the dependency graph to analyze different design choices and/or optimizations to the microarchitecture. Such features include, but are not limited to, the types and/or number of vertices used to represent a particular microarchitectural event, the cost associated with a particular microarchitectural event, the manner in which certain vertices are coupled via the edges, and/or the like.

Further features and advantages of the disclosed embodiments, as well as the structure and operation of various embodiments disclosed herein, are described in detail below with reference to the accompanying drawings. It is noted that the disclosed embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments of the present application and, together with the description, further serve to explain the principles of the embodiments and to enable a person skilled in the pertinent art to make and use the embodiments.

Figure 1:
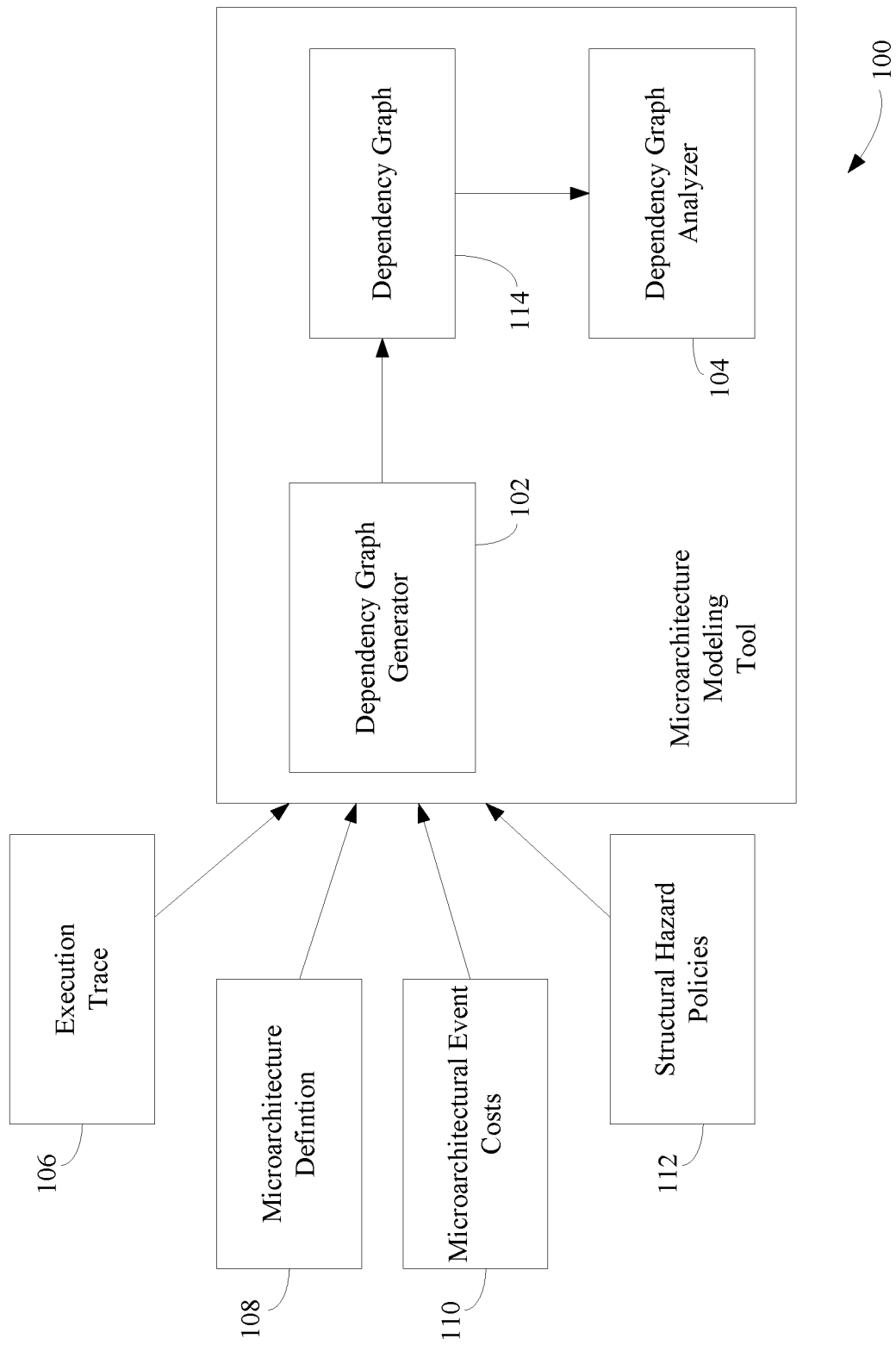
FIG. 1 shows a block diagram of an example microarchitecture modeling tool, according to an example embodiment.

The features and advantages of the present embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features disclosed herein. The scope of the present embodiments is not limited to the description provided herein. The features disclosed herein merely exemplify the disclosed embodiments, and modified versions of the features disclosed herein are also encompassed by the present embodiments. The embodiments described herein are defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments for Performance Modeling and Analysis of Microprocessors Using Dependency Graphs Embodiments described herein are directed to a microarchitecture modeling tool that is configured to model and analyze a microarchitecture using a dependency graph. The dependency graph may be generated based on an execution trace of a program and a microarchitecture definition that specifies various features and/or characteristics of the microarchitecture on which the execution trace is based. The dependency graph includes a plurality of vertices, each vertex representing a particular microarchitectural event that occurred during execution of the program, and a plurality of edges that couple the plurality of vertices. Each edge represents a particular dependency (e.g., a data or control dependency) between the microarchitectural events represented by the coupled vertices. Each of the edges may be associated with a cost for performing a corresponding microarchitectural event (e.g., a latency or number of clock cycles required to perform microarchitectural events corresponding to the vertices coupled thereto). The dependency graph may also take into account various policies for structural hazards of the microarchitecture. The microarchitecture modeling tool analyzes the costs associated with each of the edges to determine a design metric of the microarchitecture. A user may be enabled to modify various features of the dependency graph to analyze different design choices and/or optimizations to the microarchitecture. Such features include, but are not limited to, the types and/or number of vertices used to represent a particular microarchitectural event, the cost associated with a particular microarchitectural event, the manner in which certain vertices are coupled via the edges, and/or the like.

The embodiments described herein advantageously provide improvements to computer-related technology; specifically, microprocessors. Conventional approaches for analyzing/optimizing a microprocessor design utilize a cycle-accurate simulator-based technique, where a microprocessor design is simulated on a cycle-by-cycle basis, and the engineer analyzes the resulting trace and/or waveform to determine the efficiency of the microprocessor being designed. When a change to the microprocessor is desired, the engineer must make changes to the RTL (register-transfer level) design and re-run the design through the simulator to see the effect of that change on the design. Such a technique can take weeks or even months. In contrast, the embodiments described herein provide a framework to model performance and analyze potential optimizations, design choices, and/or limitations (e.g., bottlenecks) in processor designs with more flexibility and at a much faster speed. The modeled optimizations and/or design choices may then be implemented in an actual microarchitecture design, thereby improving the efficiency of the microarchitecture itself.

These benefits make it possible to quickly evaluate multiple microarchitectural configurations, as opposed to the conventional cycle-accurate simulator-based approach described above. Specifically, the embodiments described herein only require a trace of instructions, which could be obtained by a functional simulator, or even from the hardware itself, rather than simulating the execution of the program cycle by cycle. Moreover, a large microarchitecture configuration space could be explored by simple manipulations of graph vertices and altering of edge costs. Furthermore, multiple configurations could be evaluated simultaneously using vectorized costs associated with different edges.

Still further, the embodiments described herein improve the functioning of a computing device on which the modeling tool executes. Given that execution traces include large numbers of instructions (e.g., billions of instructions), the resulting dependency graph may consume a rather large amount of memory. In some instances, the dependency graph may be so large that the computing device's memory is unable to accommodate the entire dependency graph. To remedy this issue, the embodiments described herein enable the dependency graph to be generated for designated portions of an execution trace, thereby significantly reducing the size of the dependency graph and the amount of memory utilized thereby, while still providing the benefits of the dependency graph-based analysis.

It is noted that while embodiments described herein are described with reference to modeling and analyzing a block-based microarchitecture, the embodiments described herein are applicable for modeling and analyzing any processor microarchitecture. As used herein, microarchitecture refers to the design and structure of a microprocessor utilized to execute a particular instruction set.

FIG. 1 shows a block diagram of an example microarchitecture modeling tool 100, according to an example embodiment. As shown in FIG. 1, microarchitecture modeling tool 100 comprises a dependency graph generator 102 and a dependency graph analyzer 104. Microarchitecture modeling tool 100 is configured to receive an execution trace 106, a microarchitecture definition 108, microarchitectural event costs 110, and/or structural hazard policies 112 as inputs. Dependency graph generator 102 is configured to generate a dependency graph 114 based on execution trace 106, microarchitecture definition 108, microarchitectural event costs 110, and/or structural hazard policies 112.

Execution trace 106 may comprise detailed information about the behavior of an execution of a program (e.g., a sequence of instructions (e.g., x86 instructions)) that were executed during execution of the program) on a processor (e.g., a central processing unit (CPU)). In accordance with an embodiment, the processor may be simulated using a processor model designed using a behavioral hardware description language (such as Verilog or VHDL (VHSIC (Very High Speed Integrated Circuit) Hardware Description Language). In accordance with such an embodiment, execution trace 106 may be generated using a simulator that executes the program using the simulated model. An example of such a simulator includes, but is not limited to, a functional simulator, an instruction set simulator, a cycle-accurate simulator, etc. Alternatively, execution trace 106 may be obtained via execution of the program on a physical (non-simulated), hardware-based processor. Execution trace 106 may be provided to microarchitecture modeling tool 100 as a text-based file, which comprises the sequence of instructions in a human-readable format and/or in a format readable by microarchitecture modeling tool 100.

Microarchitecture definition 108 may comprise a definition (or specification) of the microarchitecture implemented by the processor that executes the program. Microarchitecture definition may define any number of characteristics of the microarchitecture. Examples of such characteristics include, but are not limited to a number of cache ports supported by the microarchitecture, a number of physical registers supported by the microarchitecture, a number of functional units (e.g., execution units, which may include arithmetic logic units (ALUs), address generation units (AGUs), floating point units (FPUs), load/store units (LSUs), branch execution units (BEUs), etc.) supported by the microarchitecture, a commit bandwidth supported by the microarchitecture, an instruction fetch bandwidth supported by the microarchitecture, a memory bandwidth supported by the microarchitecture, a branch prediction scheme supported by the microarchitecture, one or more pipeline stages and functions thereof supported by the microarchitecture, a data forwarding scheme supported by the microarchitecture, a control flow speculation scheme supported by the microarchitecture, a memory disambiguation scheme supported by the microarchitecture, a communication network supported by the microarchitecture, an instruction window size supported by the microarchitecture, and/or an instruction issue width supported by the microarchitecture. Microarchitecture definition 108 may be generated by an architect or engineer designing the processor. Microarchitecture definition 108 may be provided to microarchitecture modeling tool 100 as a text-based file that is in a human-readable format and/or in a format readable by microarchitecture modeling tool 100.

Microarchitectural event costs 110 represent the costs associated with performing certain microarchitectural events supported by the microarchitecture. The cost associated with a particular event may, for example, represent the latency or a number of compute cycles required to perform the event. In another example, the cost may represent the gate delays associated when performing a particular event. In yet another example, the cost may represent the energy and/or power consumed when performing a particular event. Microarchitectural event costs 110 may be derived from various sources, including, but not limited to, a statistical model, a cycle-accurate simulator, hardware event counters, circuit analysis, hardware models (and/or values measured therefrom), hardware counters, ideal values (e.g., specified by an architect or engineer), and/or the like. Examples of costs of microarchitectural events specified by microarchitectural event costs 110 include, but are not limited to, a latency, one or more gate delays, or power consumption associated with a cache access hit, a latency, gate delay(s), or power consumption associated with a cache access miss, a latency, gate delay(s), or power consumption associated with accessing memory, a latency, gate delay(s), or power consumption associated with decoding an instruction, a latency, gate delay(s), or power consumption associated with a branch prediction scheme supported by the microarchitecture, a latency, gate delay(s), or power consumption associated with recovering from a misspeculation of instruction execution, a latency, gate delay(s), or power consumption associated with one or more execution units of the microarchitecture, or a latency, gate delay(s), or power consumption associated with network communication. Microarchitectural event costs 110 may be provided to microarchitecture modeling tool 100 as a text-based file that is in a human-readable format and/or in a format readable by microarchitecture modeling tool 100. The costs specified by microarchitectural event costs 110 may be stored via a data structure, such as a table, that associates different costs with different microarchitectural events (e.g., 2 clock cycles for executing a ADD instruction, 50 clock cycles for a cache miss, etc.). It is noted that the costs described above are purely exemplary and that other types of microarchitecture-related costs may be represented by microarchitectural event costs 110.

Structural hazard policies 112 may specify one or more policies for how the microarchitecture handles a structural hazard thereof. For instance, consider a scenario where three ADD instructions are ready to execute, but only one ALU is implemented in the microarchitecture. Structural hazard policies 112 may specify a scheduling order of the three instructions (i.e., the order in which the three instructions should be provided to the ALU). For instance, a policy of structural hazard policies 112 may specify that the oldest instruction is to be executed first. In a scenario where two ADD instructions and a memory instruction (e.g., a load or store instruction) are ready to execute and each of such instructions utilize the same ALU, a policy of structural hazard policies 112 may specify that the memory instruction is to be executed first. Yet another policy of structural hazard policies 112 may specify that instructions having the lowest latency should be executed first. It is noted that the policies described above are purely exemplary and that structural hazard policies 112 may specify any number of policies for many different types of structural hazards of the microarchitecture. Structural hazard policies 112 may be provided to microarchitecture modeling tool 100 as a text-based file that is in a human-readable format and/or in a format readable by microarchitecture modeling tool 100.

To generate dependency graph 114, dependency graph generator 102 may analyze execution trace 106 to determine a plurality of microarchitectural events that occurred during execution of the program. Dependency graph generator 102 may also analyze execution trace 106 to determine data dependencies and/or control dependencies between such events. An example of a data dependency is where one instruction cannot execute until it receives a result from a previous instruction. An example of a control dependency is where an instruction (such as a branch instruction, a test and branch instruction, etc.) affects the control flow of the program such that only certain instructions are executed depending on the outcome thereof. Each microarchitectural event may be represented as a vertex (or node) in dependency graph 114. A dependency between two microarchitectural events may be represented by an edge that couples the vertices representing the two microarchitectural events. Dependency graph generator 102 may also analyze microarchitectural definition 108 to determine how many vertices should be used per instruction and whether any edges should be added among the vertices to represent microarchitectural limitations, such as but not limited to structural hazards and misspeculation of control flow.

Figure 2A:
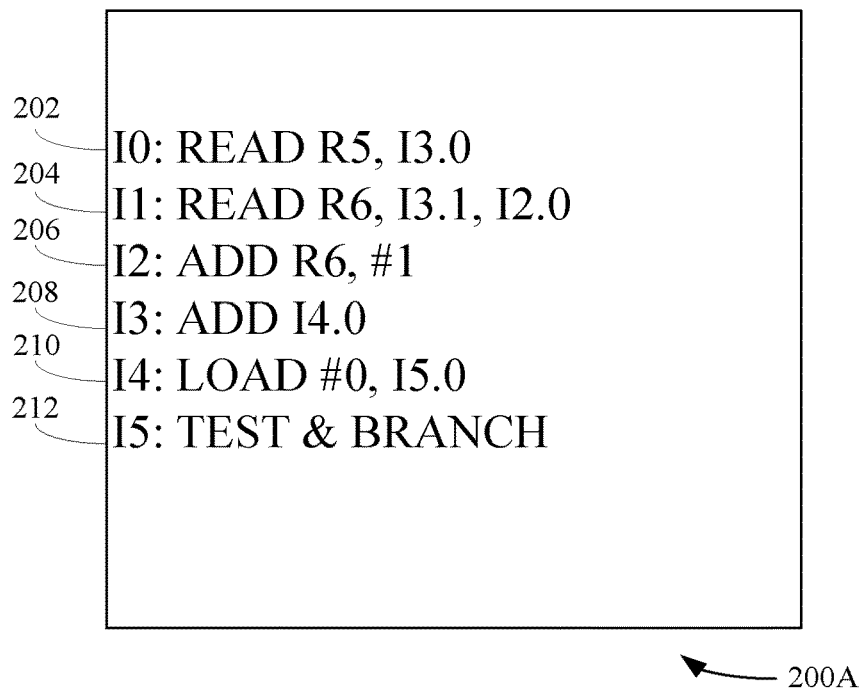
FIG. 2A shows an example sequence of instructions of an execution trace in accordance with an example embodiment.
Figure 2B:
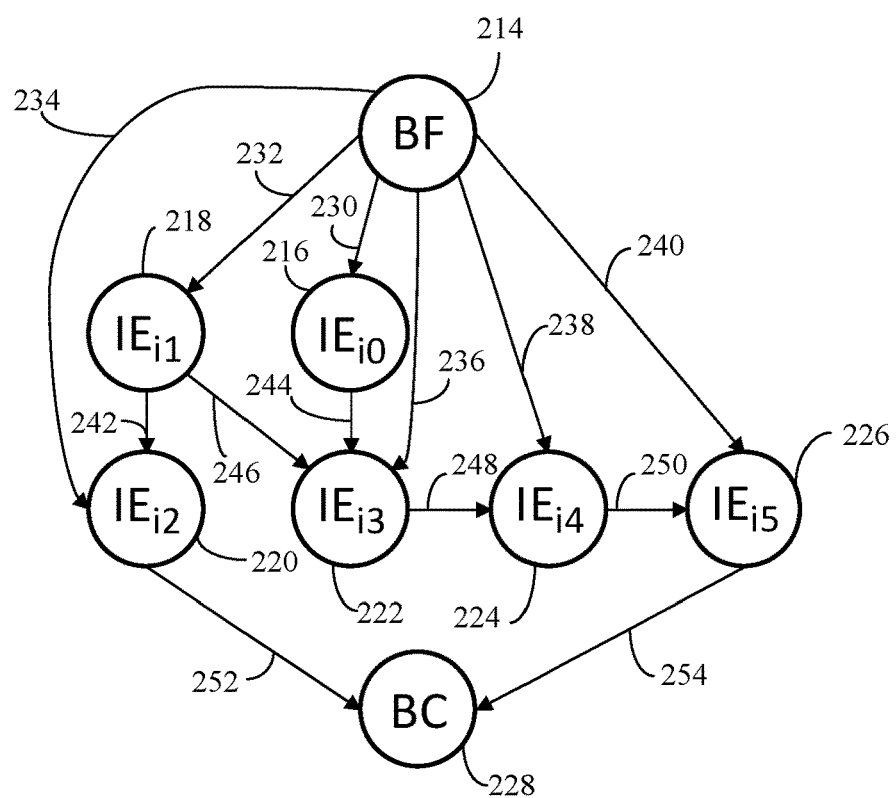
FIG. 2B depicts an example dependency graph that is generated based on the sequence of instructions shown in FIG. 2A in accordance with an example embodiment.

For instance, FIG. 2A depicts an example sequence of instructions 200A of an execution trace (e.g., execution trace 106), and FIG. 2B depicts an example dependency graph 200B that is generated based on sequence of instructions 200A in accordance with an example embodiment. It is noted that sequence of instructions 200A are configured to execute on a block-based microarchitecture. In accordance with such an architecture, a program is encoded by grouping a plurality of one or more instructions into an atomic block (referred to as an instruction block). An atomic block includes a set of instructions that can be fetched, executed, and/or committed "atomically" in the sense they may be fetched, executed, and/or committed in isolation from, and without interaction with the rest of the program code (appear to the rest of the program code to occur as a single operation without interruption). In accordance with such a scenario, microarchitecture definition 108 may specify that the microarchitecture is a block-based architecture.

As shown in FIG. 2A, sequence of instructions 200A include a first instruction 202, a second instruction 204, a third instruction 206, a fourth instruction 208, a fifth instruction 210, and a sixth instruction 212. Each of instructions 202, 204, 206, 208, 210, and 212 are part of the same instruction block. Dependency graph generator 102 may parse sequence of instructions 200A and/or operands thereof to determine microarchitecture events that occur, along with the dependencies therebetween, based on execution of instructions 200A and microarchitectural definition 108. For instance, with reference to FIG. 2B, dependency graph generator 102 may determine that because the architecture is a block-based architecture, the first event was a block fetch and the last event was a block commit. Accordingly, dependency graph generator 102 may generate a vertex 214 (BF) that represents a block fetch event and a vertex 228 (BC) that represents a block commit event. Based on sequence of instructions 200A, dependency graph generator 102 may determine six microarchitectural events, each representing the execution of one of six instructions 202, 204, 206, 208, 210, and 212 (respectively shown as vertices 216, 218, 220, 222, 224, and 226). Because a block fetch must occur in order to retrieve instructions 202, 204, 206, 208, 210, and 212, dependency graph generator 102 may generate an edge between vertex 214 and each of vertices 216, 218, 220, 222, 224, and 226 (respectively shown as edges 230, 232, 234, 236, 238, and 240). Edges 230, 232, 234, 236, 238, and 240 may be representative of a microarchitectural dependency between the vertices coupled thereto.

Based on sequence of instructions 200A, dependency graph generator 102 may also determine data dependencies between certain instructions. For instance, because instruction 206 receives data via instruction 204, dependency graph generator 102 generates an edge 242 between vertices 220 and 218 to indicate a data dependency therebetween. Because instruction 208 receives data via instructions 202 and 204, dependency graph generator 102 generates an edge 244 between vertices 222 and 216 and an edge 246 between vertices 222 and 218 to indicate data dependencies therebetween. Because instruction 210 loads the data of a memory location identified by I3 (instruction 208) plus #0 and sends the data to instruction 212 (I5) (as the branch target), dependency graph generator 102 generates an edge 248 between vertices 224 and 222 to indicate a data dependency therebetween. Because instruction 212 tests whether the valued loaded into memory location #0 is in accordance with a certain condition, dependency graph generator 102 generates an edge 250 between vertices 226 and 224 to indicate a data dependency therebetween. In the example shown, a block commit occurs when all instructions that write to memory and or a general-purpose register have executed. In this example, instruction 206 writes the result of the ADD instruction to register R6. Thus, a control dependency exists between instruction 206 and the block commit operation (i.e., vertex 228). Accordingly, dependency graph generator 102 generates an edge 252 between vertices 228 and 220 to indicate a control dependency therebetween. Instruction 212 may be configured to branch to a particular instruction block depending on whether or not the condition is satisfied. Before branching to the determined block, the present instruction block must commit. Accordingly, dependency graph generator 102 generates an edge 254 between vertices 228 and 226 to indicate a control dependency therebetween.

It is noted that while the example described above with reference to FIGS. 2A and 2B illustrate intra-block dependencies, dependency graph generator 102 may be further configured to generate a dependency graph that takes into account inter-block dependencies.

Figure 3:
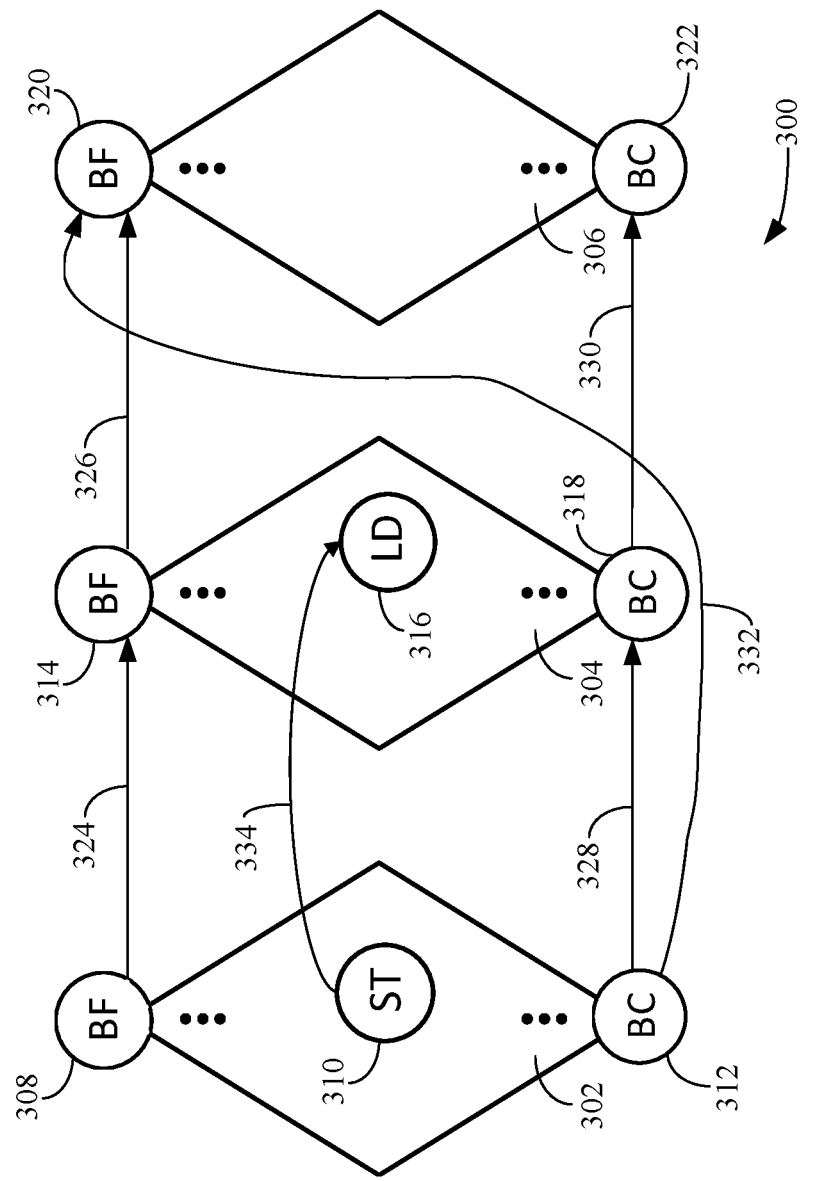
FIG. 3 depicts an example dependency graph that includes inter-block dependencies in accordance with an example embodiment.

For instance, FIG. 3 depicts an example dependency graph 300 that includes inter-block dependencies in accordance with an example embodiment. As shown in FIG. 3, each of rhombuses 302, 304, and 306 is a simplified representation of a portion of dependency graph 300 that corresponds to the execution of instructions within a particular instruction block. Each of rhombuses (or instruction blocks) 302, 304, and 306 may comprise any number of vertices representing microarchitectural events and any number of edges representing dependencies between such microarchitectural events. As shown in FIG. 3, instruction block 302 includes a vertex 308 that represents a block fetch, a vertex 310 that represents a store instruction, and a vertex 312 that represents a block commit. Instruction block 304 includes a vertex 314 that represents a block fetch, a vertex 316 that represents a load instruction, and a vertex 318 that represents a block commit. Instruction block 306 includes a vertex 320 that represents a block fetch and a vertex 322 that represents a block commit.

Dependency graph 300 shows four different types of inter-block dependencies. The first type of inter-block dependency shown by dependency graph 300 is an in-order fetch dependency, where instructions blocks are fetched in order. That is, instruction block 302 is fetched before instruction block 304, and instruction block 304 is fetched before instruction block 306. Based on an analysis of the execution trace (e.g., execution trace 106) and the microarchitecture definition (microarchitecture definition 108), dependency graph generator 102 may determine that instruction block 302 is to be fetched before instruction block 304, and therefore, generates an edge 324 that couples vertices 308 and 314. Similarly, based on an analysis of the execution trace and the microarchitecture definition, dependency graph generator 102 may determine that instruction block 304 is to be fetched before instruction block 306, and therefore generates, an edge 326 that couples vertices 314 and 320.

The second type of inter-block dependency shown by dependency graph 300 is an in-order commit dependency, where instructions blocks are committed in order. That is, instruction block 302 is committed before instruction block 304, and instruction block 304 is committed before instruction block 306. Based on an analysis of the execution trace and the microarchitecture definition, dependency graph generator 102 may determine that instruction block 302 is to be committed before instruction block 304, and therefore, generates an edge 328 that couples vertices 312 and 318. Similarly, based on an analysis of the execution trace and the microarchitecture definition, dependency graph generator 102 may determine that instruction block 304 is to be committed before instruction block 306, and therefore, generates an edge 330 that couples vertices 318 and 322.

The third type of inter-block dependency shown by dependency graph 300 is a limited block window dependency. For instance, a block-based processor may be configured to have a particular window size, which represents the number of instruction blocks that may be stored in the processor's instruction buffer at any given time. The microarchitecture definition may specify the window size supported by the block-based processor. In the example shown in FIG. 3, the window size is two. Thus, instruction blocks 302 and 304 may be fetched and stored in the instruction buffer. However, instruction block 306 cannot be fetched until instruction block 302 commits. Accordingly, based on an analysis of the execution trace and the microarchitecture definition, dependency graph generator 102 may determine that instruction block 302 is to be committed before instruction block 306 is fetched, and therefore, generates an edge 332 that couples vertices 312 and 320.

The fourth type of inter-block dependency shown by dependency graph 300 is a data forwarding dependency, where an instruction of one instruction block reads data from a location (e.g., a register or memory location) that is written to by an instruction in another instruction block. In the example shown in FIG. 3, the store instruction represented by vertex 310 of instruction block stores data in a location that is read by the load instruction represented by vertex 316 of instruction block 304. Accordingly, based on an analysis of the execution trace and the microarchitecture definition, dependency graph generator 102 may determine a data forwarding dependency between vertices 310 and 316, and therefore, generates an edge 334 that couples vertices 310 and 316.

Dependency graph generator 102 may also be configured to model control flow dependencies. For example, an instruction block may include an instruction that affects the control flow (e.g., a branch instruction, a test and branch instruction, etc.). The outcome of the branch instruction may determine which instruction block to fetch next. For example, if a branch instruction evaluates to true, a first instruction block may be fetched. If the branch instruction evaluates to false, a second instruction block may be fetched. Certain processors may implement branch prediction, where the outcome of the branch instruction is predicted using a branch prediction algorithm. In the case of a block-based processor, if the prediction is correct, there is a control flow dependence from the instruction block including the branch instruction and the instruction block that is predicted to be fetched. However, if there is a misprediction, then the branch instruction must be resolved before the next instruction block is fetched. The foregoing is depicted in example dependency graphs 400A and 400B shown in FIGS. 4A and 4B, respectively.

Figure 4A:
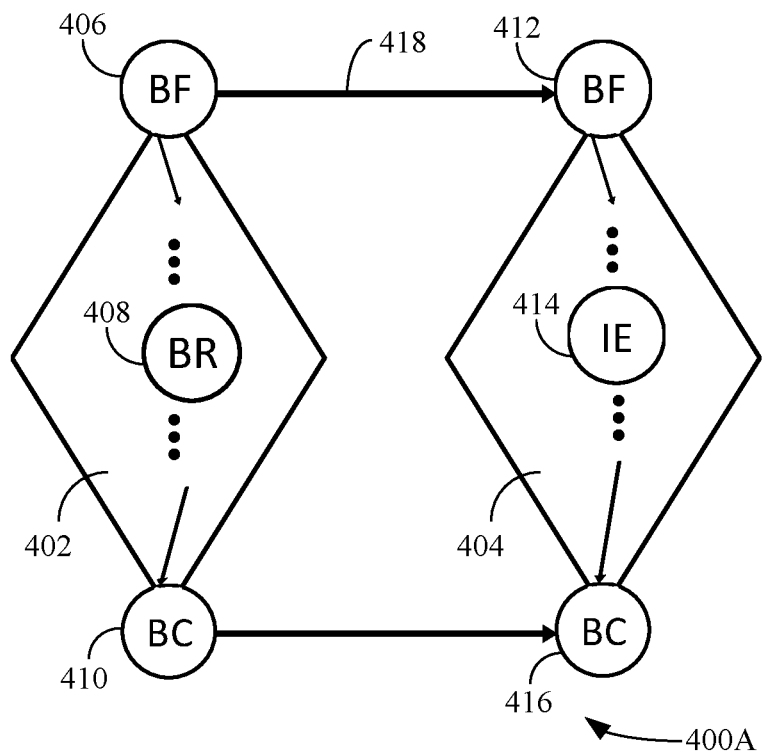
FIG. 4A depicts an example dependency graph that depicts an outcome of a branch instruction being predicted correctly in accordance with an example embodiment.
Figure 4B:
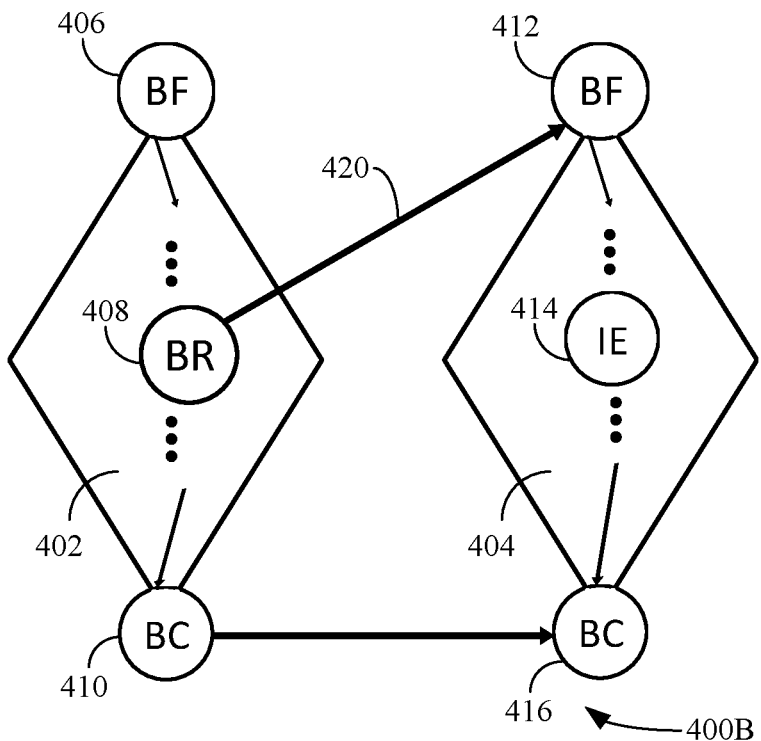
FIG. 4B depicts an example dependency graph that depicts an outcome of a branch instruction being predicted incorrectly in accordance with an example embodiment.

In particular, dependency graph 400A is generated in response to the outcome of a branch instruction being predicted correctly, and dependency graph 400B is generated in response to the outcome of the branch instruction being predicted incorrectly. As shown in FIGS. 4A and 4B, dependency graphs 400A and 400B include instruction blocks 402 and 404. Each of instruction blocks 402 and 404 comprise any number of vertices representing microarchitectural events and any number of edges representing dependencies between such microarchitectural events. For example, instruction block 402 includes a vertex 406 that represents a block fetch, a vertex 408 that represents a branch instruction, and a vertex 410 that represents a block commit. Instruction block 404 includes a vertex 412 that represents a block fetch, a vertex 414 that represents execution of a miscellaneous instruction (e.g., an ADD instruction), and a vertex 416 that represents a block commit.

As shown in FIG. 4A, based on an analysis of a particular execution trace and the microarchitecture definition, dependency graph generator 102 may determine that the outcome of the branch instruction represented by branch instruction 408 was predicted correctly, and therefore, generates an edge 418 that couples vertices 406 and 412. As shown in FIG. 4B, based on an analysis of another particular execution trace and the microarchitecture definition, dependency graph generator 102 may determine that the outcome of the branch instruction represented by branch instruction 408 was predicted incorrectly, and therefore, generates an edge 420 that couples vertices 408 and 412, thereby depicting that instruction block 404 will not be fetched until the outcome of the branch instruction is determined. Edge 420 also represents the penalty realized as a result of the misprediction. It is noted that while dependency graph 400B depicts edge 420 coupling vertices 408 and 412, dependency graph generator 102 may generate a similar edge between vertex 408 and other block fetch vertices for other instruction blocks (not shown) that are to be subsequently fetched.

Figure 5:
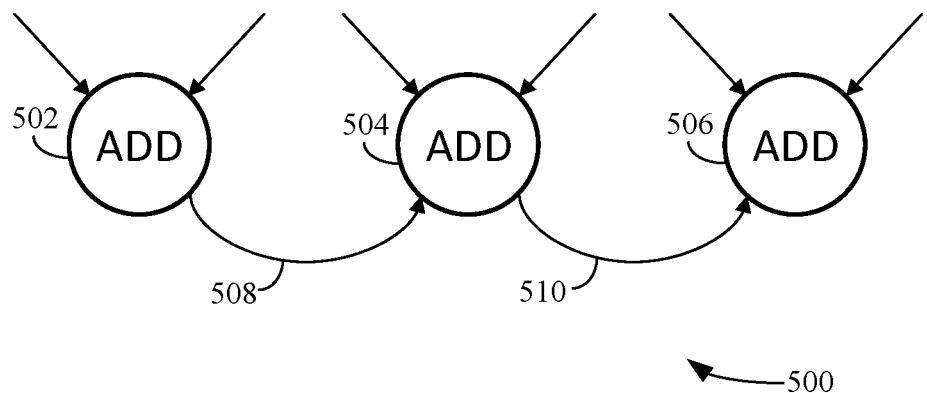
FIG. 5 depicts a portion of an example dependency graph that was generated based on structural hazard policies in accordance with an example embodiment

As described above, dependency graph generator 102 may also generate a dependency graph based on structural hazard policies 112. For example, dependency graph generator 102 may generate edges between certain vertices based on a scheduling order specified by structural hazard policies 112 to take into account a structural hazard of the microarchitecture. For example, FIG. 5 depicts a portion of an example dependency graph 500 that was generated based on structural hazard policies 112 in accordance with an example embodiment. As shown in FIG. 5, dependency graph 500 includes three vertices 502, 504, and 506. Vertex 502 represents a first ADD instruction, second vertex 504 represents a second ADD instruction, and third vertex 506 represents a third ADD instruction. In the example shown in FIG. 5, microarchitecture definition 108 may specify that the processor implements a single ALU, and structural hazard policies 112 may specify that the oldest instruction should be executed by the ALU first in the event that more than one instruction is ready for execution. In FIG. 5, all three ADD instructions are ready to execute, but the first ADD instruction is the oldest instruction, the second ADD instruction is the next oldest instruction, and the third ADD instruction is the newest instruction. In accordance with structural hazard policies 112, each ADD instruction shown in FIG. 5 must be executed sequentially, from oldest to newest. Accordingly, based on an analysis of execution trace 106, microarchitecture definition 108, and structural hazard policies 112, dependency graph generator 102 may generate an edge 508 between vertices 502 and 504 and an edge 510 between vertices 504 and 506. Edge 508 indicates that the second ADD instruction executes after the first ADD instruction, and edge 510 indicates that the third ADD instruction executes after the second ADD instruction.

Figure 6:
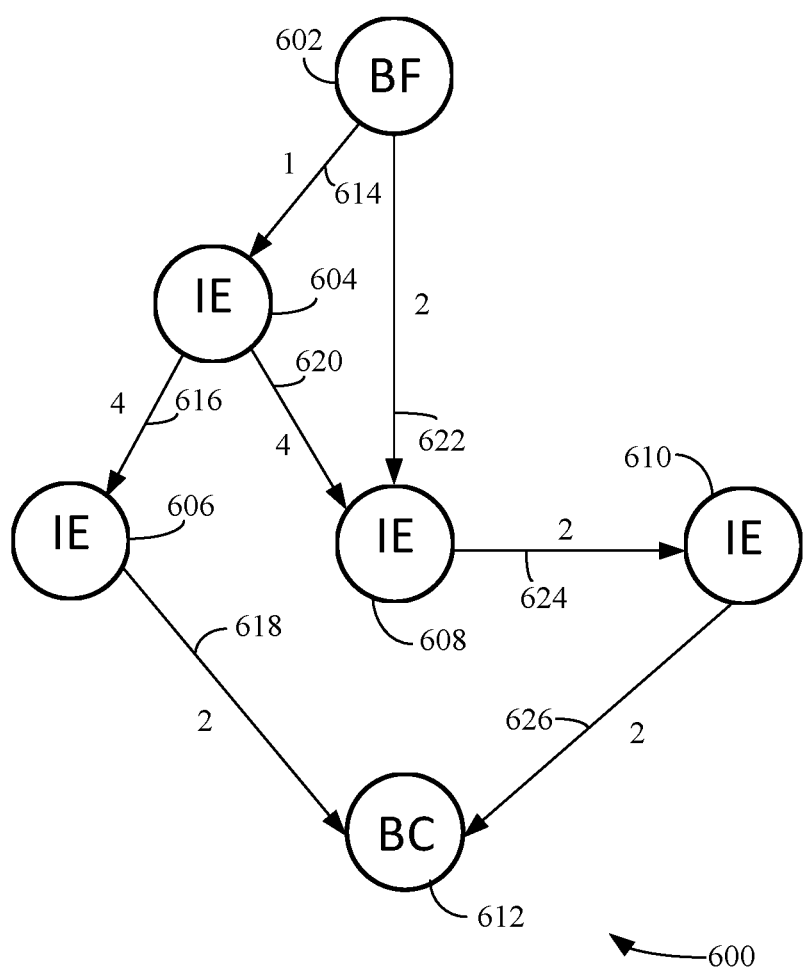
FIG. 6 depicts an example dependency graph that includes costs associated with edges thereof in accordance with an example embodiment.

Dependency graph generator 102 may also associate costs to each edge generated for a dependency graph based on microarchitectural event costs 110. For example, FIG. 6 depicts an example dependency graph 600 that includes costs associated with each of edges 614, 616, 618, 620, 622, 624, and 626 in accordance with an example embodiment. As shown in FIG. 6, vertex 602 represents a block fetch, and vertex 612 represents a block commit. Each of vertices 604, 606, 608, and 610 represent various instruction executions, although the embodiments described herein are not so limited. As further shown in FIG. 6, edge 614 is associated with a cost of 1, edge 616 is associated with a cost of 4, edge 618 is associated with a cost of 2, edge 620 is associated with a cost of 4, edge 622 is associated with a cost of 2, edge 624 is associated with a cost of 2, and edge 626 is associated with a cost of 2. Each cost may be associated with the microarchitectural events represented by the vertices coupled thereto. For instance, the cost for edge 614 may represent the cost for performing the block fetch and/or decoding the instruction represented by vertex 604. The cost for edge 622 may represent the cost for performing the block fetch and/or decoding the instruction represented by vertex 608. The cost for edges 616 and 620 may represent the cost for executing the instructions represented by vertex 604. The cost for edge 618 may represent the cost for executing the instruction represented by vertex 606. The cost for edge 624 may represent the cost for executing the instruction represented by vertex 608. The cost for edge 626 may represent the cost for executing the instruction represented by vertex 610.

Dependency graph generator 102 may determine the cost for each edge utilizing microarchitectural event costs 110. For instance, in an embodiment in which microarchitectural event costs 110 comprises a table that associates different microarchitectural events to a particular cost, dependency graph generator 102 may query the table using an identifier that identifies the microarchitectural event(s) that are represented by the vertex (or vertices) coupled to a particular edge. The table may return the cost associated with the identified microarchitectural event(s). Upon receiving the cost, dependency graph generator 102 may associate the cost with the edge. Once dependency graph 114 is generated and all the costs have been associated to the edges, dependency graph 114 may be provided to dependency graph analyzer 104. Dependency graph analyzer 104 may be configured to render dependency graph 114 on a display screen via a graphical user interface (GUI).

To associate a cost with an edge, dependency graph generator 102 may generate an identifier next to the edge that identifies the cost. In another example, dependency graph generator 102 may place the identifier such that it overlaps with the edge. In yet another example, dependency graph generator 102 may not display the identifier until a user selects a particular edge via the GUI (i.e., the cost remains hidden until a user selects the edge). Upon selecting a edge, the associated cost may be displayed in accordance with any of the examples described above. It is noted that while the embodiments described herein describe that a cost is associated with an edge, costs may also be associated with vertices in addition or in lieu of edges.

Dependency graph analyzer 104 may be configured to analyze dependency graph 114 and determine one or more design metrics of the microarchitecture based on analysis of the microarchitectural event costs associated with each of the edges. Examples of design metrics include, but are not limited to, the critical path (representing the longest propagation sequence through the datapath of the microarchitecture), gate delays (e.g., in nanoseconds) associated with certain microarchitectural events that occur during execution of the program, the execution time of the program, the energy and/or power consumed by the microarchitecture for a given program and/or whether the design will exceed a certain thermal design power (TDP) level), the maximum instruction level parallelism (ILP) exposed at different points in the program, and/or the like.

For instance, in an embodiment in which the costs represent the latency or a number of compute cycles required to perform the associated microarchitectural event, dependency graph analyzer 104 may apply a graph traversal algorithm that determines the total cost for all the paths in dependency graph 114 and select the path having the greatest total cost as being the critical path. The path may be shown to a user via the GUI. For example, dependency graph analyzer 104 may highlight all the vertices and edges that couple such vertices that are part of the critical path. For instance, with reference to FIG. 6, dependency graph analyzer 104 may highlight the path that comprises vertices 602, 604, 608, 610, and 612 and edges 614, 620, 624, and 626 as being the critical path, as this path has the greatest total cost (i.e., 9). In another example, dependency graph analyzer 104 may output a list of microarchitectural events associated with the critical path.

The user may be able to inspect dependency graph 114 and/or the identified critical path to determine bottlenecks of the microarchitecture and/or make alterations to dependency graph 114 (representative of different design choices) in an attempt to determine an optimized processor design via the GUI (e.g. by resizing, adding, and/or removing certain resources, such as instruction buffers, ALUs, etc.). After determining an optimal microarchitecture design, an engineer may implement the modeled changes in a hardware-based microarchitecture design (e.g., by modifying RTL representative of the microarchitecture design).

Dependency graph analyzer 104 may utilize other graph traversal algorithms (e.g., breadth first search (BFS), depth first search (DFS), graph bisection, etc.) to determine other design metrics, such as, but not limited to, the maximum instruction level parallelism (ILP) at various points during program execution, the execution time of the program, the TDP of the design, etc.

One alteration that a user may make via the GUI is to the costs associated with each of the edges of dependency graph 114. For instance, the cost associated with each edge may be user-modifiable via the GUI. The user may select the cost and change the value to associate an edge with a new cost. Thereafter, the user may cause dependency graph analyzer 104 to recalculate the design metric(s) (e.g., via a menu option provided via the GUI).

In accordance with an embodiment, a user may specify a plurality of costs with a single edge, for example, in a vector format (e.g., [1, 3, 6]). For example, suppose the user would like to know how the processor design performs when a functional unit has different cycle latencies (e.g., a 1-cycle latency, a 3-cycle latency, a 6-cycle latency, etc.). In this case, the user may associate vectorized costs with the edge coupled to the vertex corresponding to the functional unit execution event (e.g., [1, 3, 6]). Dependency graph analyzer 104 may recalculate the critical path based on the vectorized costs in a single analysis session. For example, instead of having the user change the cost of the functional unit execution event a first time and having the dependency graph analyzer 104 recalculate the critical path, and subsequently changing the cost of the functional unit execution event a second time and having the dependency graph analyzer 104 recalculate the critical path a second time, the user may simply specify all the possible costs in a vector format, as described above. Dependency graph analyzer 104 may determine different critical paths for each of the costs specified in the vector and highlight each determined critical path. This advantageously enables dependency graph analyzer 104 to analyze multiple design configurations and/or design choices simultaneously, considerably speeding up the design development time of a processor. This may all be performed without having to regenerate dependency graph 114 or obtaining a new execution trace and/or microarchitecture definition 108.

In accordance with another embodiment, each cost specified in the vector format may be representative of a different type of cost. For example, the first cost specified may be associated with a latency associated with performing the associated event, the second cost specified may be associated with gate delay(s) associated with performing the associated event, and the third cost specified may be associated with the power consumed when performing the associated event. Vectorizing different types of costs advantageously enables multiple aspects of the microarchitecture design (e.g., the critical path, the execution time of the program on the design, the power consumed by different events, etc.) to be analyzed and determined in a single analysis session.

Another alteration that a user may make via the GUI is to the vertices of dependency graph 114. For instance, a user may add and/or remove vertices to represent a particular microarchitectural event. In a particular example, in order to identify the number of optimal architectural registers for a processor design, a solution could possibly be modifying vertices of a number of READ instructions and/or LOAD instructions and adding necessary vertices that represent STORE instructions. In another example, to identify the optimal number of instruction fan-outs and/or broadcast channels, vertices representing non-immediate MOV instructions may be added or removed. The costs of the edges coupling such vertices may also be modified, for example, to represent the latency associated with providing data via the broadcast channels. The design metric analysis may be reperformed after such alterations are made to dependency graph 114.

Yet another alteration that a user may make is to the structural hazard policy. For instance, the user may modify certain edges to designate a new structural hazard policy to be utilized. For instance, with reference to FIG. 5, the user may change the order in which the three ADD instructions are executed by modifying edges 508 and 510 and/or adding additional edges between vertices 502, 504, and/or 506. For instance, in order to change the scheduling policy such that the newest ADD instruction is to be executed first, the user may change the direction of edges 508 and 510 so that the second ADD instruction (represented by vertex 504) executes after the third ADD instruction executes (represented by vertex 506) and so that the first ADD instruction (represented by vertex 502) executes after the second ADD instruction executes.

It is noted that while the embodiments described above describe that alterations may be made via a GUI, alterations may also be made via other techniques. Such techniques include, but are not limited to, creating and/or modifying a text-based file to indicate the alterations. Microarchitecture modeling tool 100 may process the file and implement the changes specified thereby.

In certain scenarios, dependency graph 114 may be very large in size, and therefore, consume a large amount of memory. Dependency graph 114 may be so large that the memory is unable to accommodate the entire dependency graph. To remedy this issue, the user may cause microarchitecture modeling tool 100 to generate a dependency graph for certain one or more portions of execution trace 106. For instance, the user may annotate certain portions of execution trace 106 with an identifier. Dependency graph generator 102 may only generate a dependency graph for the portions of execution trace 106 that are associated with the identifier (and does not generate a dependency graph for the portions of execution trace 106 that are not associated with the identifier).

Alternatively, a user may annotate certain portions of the program with the identifier. When the simulator executes the program, it may only generate a partial execution trace based on the identifier. The partial execution trace may be stored in a memory of the computing device on which microarchitecture modeling tool 100 executes. To generate dependency graph 114, microarchitecture modeling tool 100 may retrieve the partial execution trace from the memory, and dependency graph generator 102 generates a dependency graph based on the partial execution trace. It is noted that while dependency graph generator 102 only generates a dependency graph based on portions of an execution trace or a partial execution trace, dependency graph analyzer 104 may still perform an analysis on portions of the execution trace for which no dependency graph is generated. For instance, suppose an execution comprises two portions, where the first portion does not have a dependency graph generated therefor and the second portion does have a dependency graph generated therefor. To properly calculate design metric(s) for the microarchitecture, dependency graph analyzer 104 may still need to analyze the microarchitecture events that occurred during the first portion and determine the costs for performing such events. The dependency graph generated for the second portion may take into account the cost determined for the first portion. In one particular example, the dependency graph may include a connector node coupled to the vertex that represents the first microarchitecture event that occurs during execution of the second portion of the program. The connector node contains the analysis information obtained for the first portion (e.g., the costs determined for performing the microarchitectural events during the first portion of the program).

Figure 7:
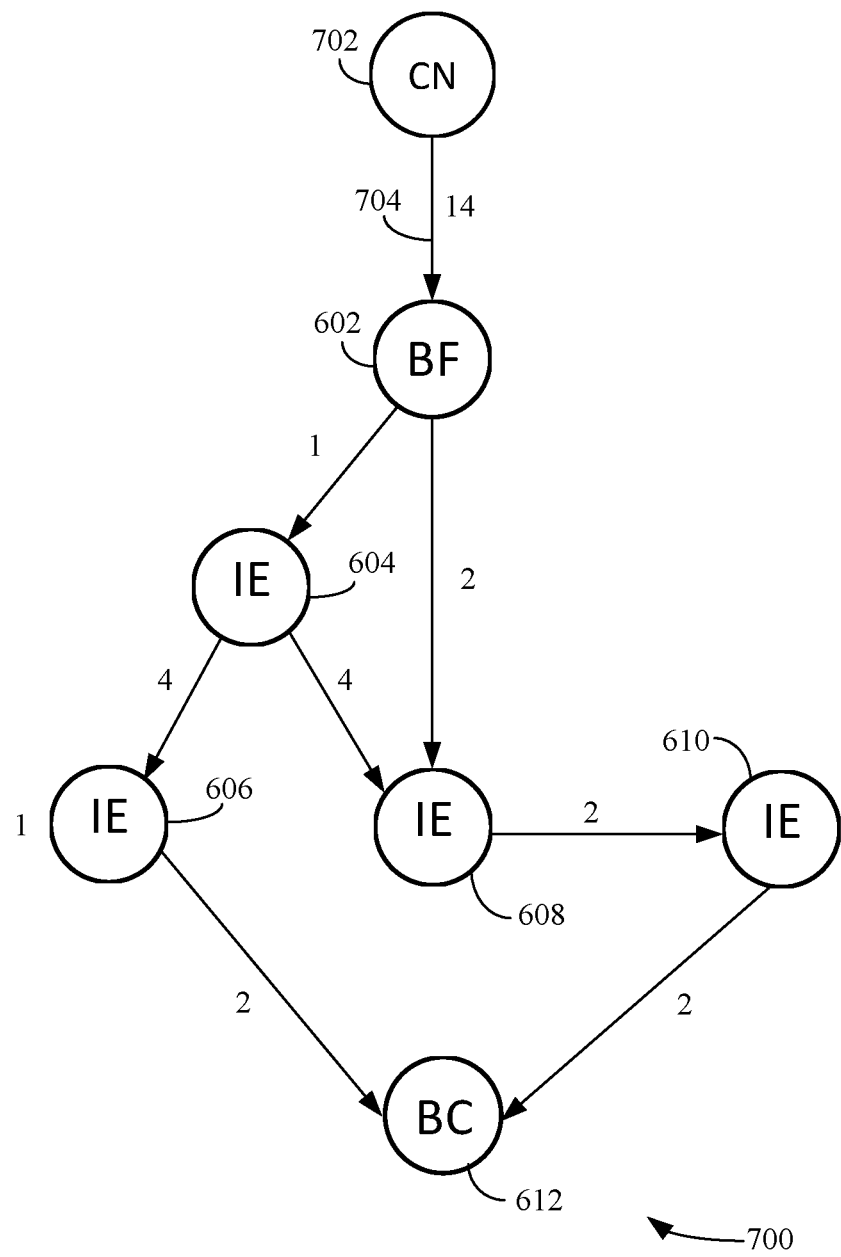
FIG. 7 depicts an example dependency graph that includes a connector node in accordance with an example embodiment.

For instance, FIG. 7 depicts an example dependency graph 700 that includes a connector node 702 in accordance with an example embodiment. Dependency graph 700 is an example of dependency graph 600, but further includes connector node 702. As shown in FIG. 7, connector node 702 is connected to vertex 602 via an edge 704. Vertex 602 represents the first microarchitectural event that occurred during execution of a second portion of a program (i.e., a block fetch). As further shown in FIG. 6, edge 704 is associated with a cost of 14, which is a cumulative cost of executing the microarchitectural events during the first portion of the program. When determining the design metric(s) for both the first and second portions, dependency graph analyzer 104 may take into account the costs determined for the first portion (i.e., 14), along with the costs determined for the microarchitectural events that occurred during the second portion.

Figure 8:
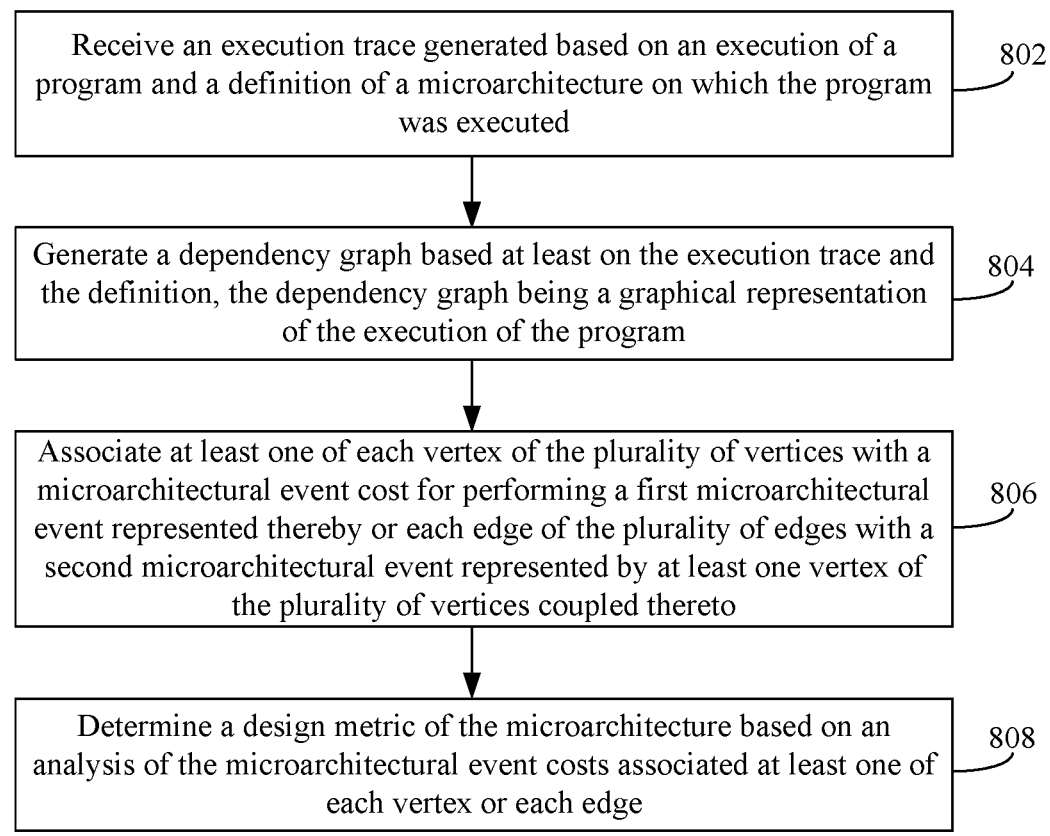
FIG. 8 depicts a flowchart for modeling and analyzing a microarchitecture via a microarchitecture modeling tool in accordance with an example embodiment.
Figure 9:
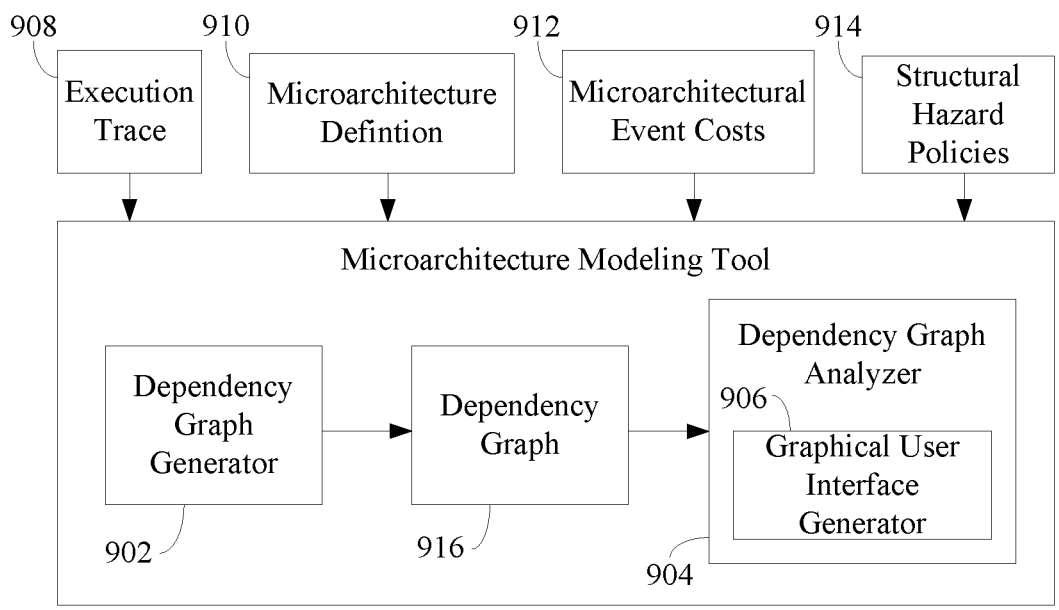
FIG. 9 depicts a block diagram of an example microarchitecture modeling tool in accordance with another example embodiment.

Accordingly, a microarchitecture may be modeled and analyzed in many ways. For example, FIG. 8 is a flowchart 800 for modeling and analyzing a microarchitecture via a microarchitecture modeling tool in accordance with an example embodiment. Flowchart 800 is described with respect to FIG. 9 for illustrative purposes. FIG. 9 shows a block diagram of a microarchitecture modeling tool 900 in accordance with an example embodiment. Microarchitecture modeling tool 900 is an example of microarchitecture modeling tool 100, as shown in FIG. 1. As shown in FIG. 9, microarchitecture modeling tool 900 comprises a dependency graph generator 902 and a dependency graph analyzer 904. Dependency graph analyzer 904 comprises a graphical user interface generator 906. As described below, microarchitecture modeling tool 900 may utilize an execution trace 908, a microarchitecture definition 910, microarchitectural event costs 912 and/or structural hazard policies 914 to model and/or analyze a microarchitecture. Dependency graph generator 902, dependency graph analyzer 904, execution trace 908, microarchitecture definition 910, microarchitectural event costs 912, and structural hazard policies 914 are examples of dependency graph generator 102, dependency graph analyzer 104, execution trace 106, microarchitecture definition 108, microarchitectural event costs 110, and structural hazard policies 112, shown in FIG. 1. Flowchart 800 and microarchitecture modeling tool 900 are described as follows.

Flowchart 800 begins with step 802. In step 802, an execution trace generated based on an execution of a program and a definition of a microarchitecture are received. For instance, with reference to FIG. 9, dependency graph generator 902 of microarchitecture modeling tool 900 receives execution trace 908 and microarchitecture definition 910.

In accordance with one or more embodiments, the definition of the microarchitecture (e.g., microarchitecture definition 910) specifies one or more of a number of cache ports supported by the microarchitecture, a number of physical registers supported by the microarchitecture, a number of functional units supported by the microarchitecture, a commit bandwidth supported by the microarchitecture, an instruction fetch bandwidth supported by the microarchitecture, a memory bandwidth supported by the microarchitecture, a branch prediction scheme supported by the microarchitecture, one or more pipeline stages and functions thereof supported by the microarchitecture, a data forwarding scheme supported by the microarchitecture, a control flow speculation scheme supported by the microarchitecture, a memory disambiguation scheme supported by the microarchitecture, a communication network supported by the microarchitecture, an instruction window size supported by the microarchitecture, or an instruction issue width supported by the microarchitecture.

At step 804, a dependency graph is generated based at least on the execution trace and the definition, the dependency graph being a graphical representation of the execution of the program and comprising a plurality of vertices, each vertex of the plurality of vertices representing a microarchitectural event that occurred during execution of the program, each vertex of the plurality of vertices being coupled to at least another vertex of the plurality of vertices via an edge, the edge representing a dependency between the microarchitectural events represented by edge-coupled vertices. For example, with reference to FIG. 9, dependency graph generator 902 may generate a dependency graph 916 based on execution trace 908 and microarchitecture definition 910. Dependency graph 916 may be an example of any of dependency graph 114 (as shown in FIG. 1), dependency graph 200B (as shown in FIG. 2B), dependency graph 300 (as shown in FIG. 3), dependency graphs 400A and 400B (as shown in FIGS. 4A and 4B), dependency graph 500 (as shown in FIG. 5), dependency graph 600 (as shown in FIG. 6), and/or dependency graph 700 (as shown in FIG. 7).

At step 806, at least one of each vertex of the plurality of vertices is associated with a microarchitectural event cost for performing a first microarchitectural event represented thereby or each edge of the plurality of edges is associated with a second microarchitectural event represented by at least one vertex of the plurality of vertices coupled thereto. For example, with reference to FIG. 9, dependency graph generator 902 may associate a microarchitectural event cost to each edge of the plurality of edges and/or each vertex of the plurality of vertices of dependency graph 916. Each microarchitectural event cost may be obtained via microarchitectural event costs 912.

In accordance with one or more embodiments, the microarchitectural event costs (e.g., microarchitectural event costs 912) specify at least one of a latency associated with a cache access hit, a latency associated with a cache access miss, a latency associated with accessing memory, a latency associated with decoding an instruction, a latency associated with a branch prediction scheme supported by the microarchitecture, a latency associated with recovering from a misspeculation of instruction execution, a latency associated with one or more execution units of the microarchitecture, or a latency associated with network communication;

At step 808, a design metric of the microarchitecture is determined based on an analysis of the microarchitectural event costs associated with at least one of the plurality of vertices or the plurality of edges. For instance, with reference to FIG. 9, dependency graph analyzer 904 may determine a design metric of the microarchitecture based on an analysis of the microarchitectural event costs associated with at least one of the plurality of vertices or the plurality of edges.

In accordance with one or more embodiments, user input is received that modifies at least one of the microarchitectural event costs associated with the plurality of edges, the microarchitectural event costs associated with the plurality of vertices at least one of the plurality of vertices, or at least one of the plurality of edges to model a change in the microarchitecture. A second design metric of the microarchitecture is determined based on the modification. For example, with reference to FIG. 9, graphical user interface generator 906 may be configured to generate a GUI on a display screen utilized by a user (not shown) to receive user input that modifies at least one of the microarchitectural event costs associated with the plurality of edges, at least one of the plurality of vertices, or at least one of the plurality of edges to model a change in the microarchitecture.

In accordance with one or more embodiments, the modeled change is implemented in a hardware-based microarchitecture. For instance, after determining an optimal microarchitecture design, an engineer may implement the modeled change in a hardware-based microarchitecture design (e.g., by modifying RTL representative of the microarchitecture design).

In accordance with one or more embodiments, the user input specifies a plurality of microarchitectural event costs for at least one of a particular edge of the plurality of edges or a particular vertex of the plurality of vertices in a vector format.

In accordance with one or more embodiments, determining the second design metric of the microarchitecture is based on an analysis of the plurality of microarchitectural event costs specified by the user. For example, with reference to FIG. 9, dependency graph analyzer 904 may determine the second design metric of the microarchitecture based on an analysis of the plurality of microarchitectural event costs specified by the user (e.g., via the GUI).

In one or more embodiments, the method further comprises receiving a policy that specifies how the microarchitecture handles a structural hazard thereof, said generating a dependency graph comprising generating the dependency graph based at least on the execution trace, the definition, and the policy. For example, with reference to FIG. 9, dependency graph generator 902 receives structural hazard policies 914, and dependency graph generator 902 generates dependency graph 916 based at least on execution trace 908, microarchitecture definition 910, and structural hazard policies 914.

In one or more embodiments, the method further comprises receiving an input that specifies a portion of the execution trace for which the dependency graph is generated, said generating the dependency graph comprising generating the dependency graph based on the portion of the execution trace and the definition. For example, with reference to FIG. 9, dependency graph analyzer 904 may receive input via a GUI generated by graphical user interface generator 906. The input specifies a portion of the execution trace for which dependency graph 916 is generated. It is noted that graphical user interface generator 906 may be incorporated in dependency graph generator 902 in conjunction with or in lieu of dependency graph analyzer 904. Dependency graph generator 902 generates dependency graph 916 based on the portion of the execution trace (e.g., a portion of execution trace 908) and microarchitecture definition 910.

III. Example Computer System Implementation

The systems and methods described above, may be implemented in hardware, or hardware combined with one or both of software and/or firmware. For example, microarchitecture modeling tool 100, dependency graph generator 102, dependency graph analyzer 104, microarchitecture modeling tool 900, dependency graph generator 902, dependency graph analyzer 904, and/or flowchart 800 may be implemented as computer program code/instructions configured to be executed in one or more processors and stored in a computer readable storage medium. Alternatively, microarchitecture modeling tool 100, dependency graph generator 102, dependency graph analyzer 104, microarchitecture modeling tool 900, dependency graph generator 902, dependency graph analyzer 904, and/or flowchart 800 may be implemented in one or more SoCs (system on chip). An SoC may include an integrated circuit chip that includes one or more of a processor (e.g., a central processing unit (CPU), microcontroller, microprocessor, digital signal processor (DSP), etc.), memory, one or more communication interfaces, and/or further circuits, and may optionally execute received program code and/or include embedded firmware to perform functions.

Figure 10:
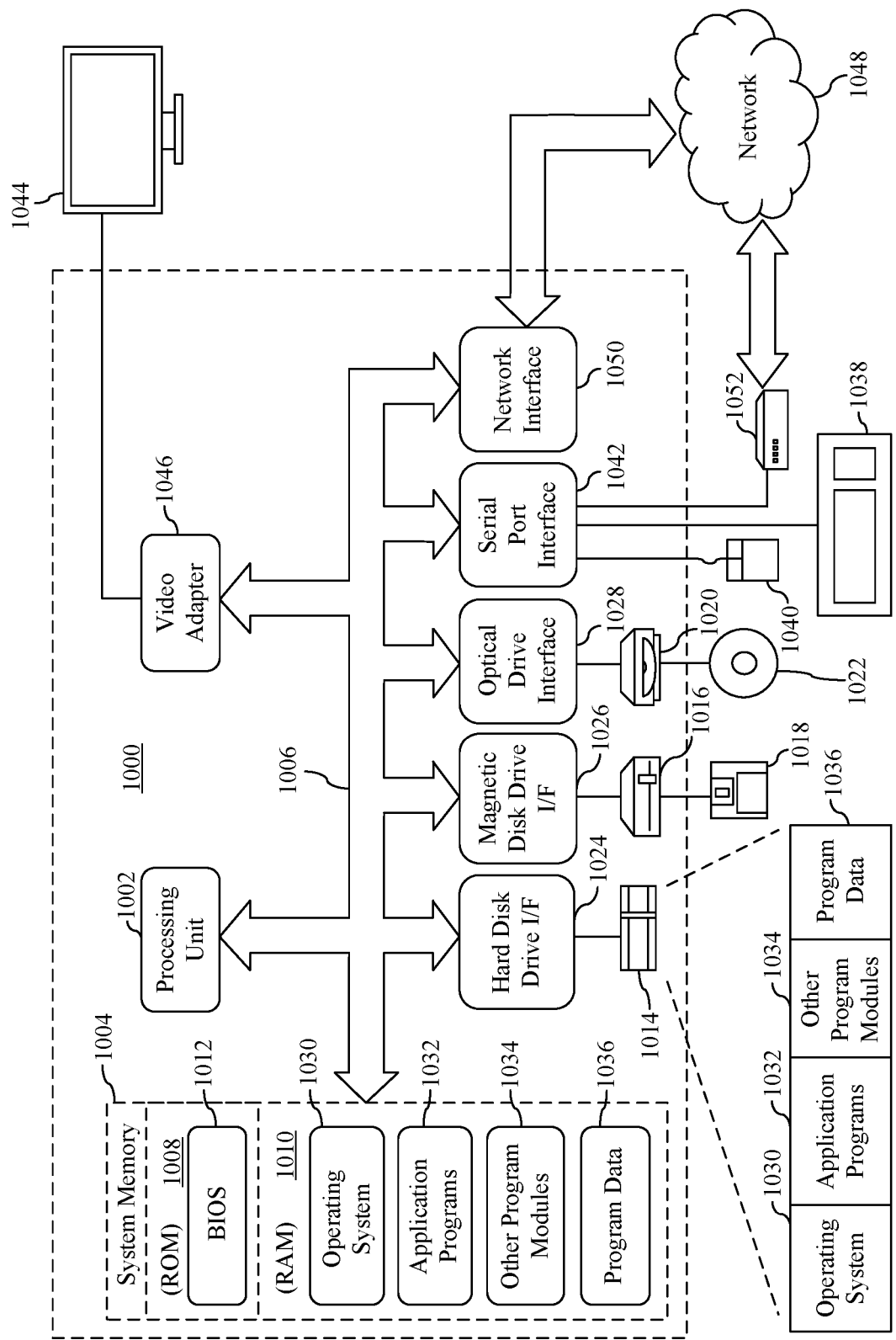
FIG. 10 is a block diagram of an example computing device that may be used to implement embodiments.

Furthermore, FIG. 10 depicts an exemplary implementation of a computing device 1000 in which embodiments may be implemented, including microarchitecture modeling tool 100, dependency graph generator 102, dependency graph analyzer 104, microarchitecture modeling tool 900, dependency graph generator 902, dependency graph analyzer 904, and/or each of the components described therein, and flowchart 800.

The description of computing device 1000 provided herein is provided for purposes of illustration, and is not intended to be limiting. Embodiments may be implemented in further types of computer systems, as would be known to persons skilled in the relevant art(s).

As shown in FIG. 10, computing device 1000 includes one or more processors, referred to as processor circuit 1002, a system memory 1004, and a bus 1006 that couples various system components including system memory 1004 to processor circuit 1002. Processor circuit 1002 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 1002 may execute program code stored in a computer readable medium, such as program code of operating system 1030, application programs 1032, other programs 1034, etc. Bus 1006 represents one or more of any of several types of bus structures, including a memory bus or memory controller, a peripheral bus, an accelerated graphics port, and a processor or local bus using any of a variety of bus architectures. System memory 1004 includes read only memory (ROM) 1008 and random access memory (RAM) 1010. A basic input/output system 1012 (BIOS) is stored in ROM 1008.

Computing device 1000 also has one or more of the following drives: a disk drive 1014 for reading from and writing to a hard disk or a solid state drive, a magnetic disk drive 1016 for reading from or writing to a removable magnetic disk 1018, and an optical disk drive 1020 for reading from or writing to a removable optical disk 1022 such as a CD ROM, DVD ROM, or other optical media. Hard disk drive 1014, magnetic disk drive 1016, and optical disk drive 1020 are connected to bus 1006 by a hard disk drive interface 1024, a magnetic disk drive interface 1026, and an optical drive interface 1028, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 1030, one or more application programs 1032, other programs 1034, and program data 1036. Application programs 1032 or other programs 1034 may include, for example, computer program logic (e.g., computer program code or instructions) for implementing the systems described above, including the dependency graph-based performance modeling and analysis techniques described above in reference to FIGS. 1-9.

A user may enter commands and information into the computing device 1000 through input devices such as keyboard 1038 and pointing device 1040. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 1002 through a serial port interface 1042 that is coupled to bus 1006, but may be connected by other interfaces, such as a parallel port, game port, or a universal serial bus (USB).

A display screen 1044 is also connected to bus 1006 via an interface, such as a video adapter 1046. Display screen 1044 may be external to, or incorporated in computing device 1000. Display screen 1044 may display information, as well as being a user interface for receiving user commands and/or other information (e.g., by touch, finger gestures, virtual keyboard, etc.). In addition to display screen 1044, computing device 1000 may include other peripheral output devices (not shown) such as speakers and printers.

Computing device 1000 is connected to a network 1048 (e.g., the Internet) through an adaptor or network interface 1050, a modem 1052, or other means for establishing communications over the network. Modem 1052, which may be internal or external, may be connected to bus 1006 via serial port interface 1042, as shown in FIG. 10, or may be connected to bus 1006 using another interface type, including a parallel interface.

As used herein, the terms "computer program medium," "computer-readable medium," and "computer-readable storage medium" are used to generally refer to physical hardware media such as the hard disk associated with hard disk drive 1014, removable magnetic disk 1018, removable optical disk 1022, other physical hardware media such as RAMs, ROMs, flash memory cards, digital video disks, zip disks, MEMs, nanotechnology-based storage devices, and further types of physical/tangible hardware storage media (including system memory 1004 of FIG. 10). Such computer-readable storage media are distinguished from and non-overlapping with communication media (do not include communication media or modulated data signals). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media.

As noted above, computer programs and modules (including application programs 1032 and other programs 1034) may be stored on the hard disk, magnetic disk, optical disk, ROM, RAM, or other hardware storage medium. Such computer programs may also be received via network interface 1050, serial port interface 1042, or any other interface type. Such computer programs, when executed or loaded by an application, enable computing device 1000 to implement features of embodiments discussed herein. Accordingly, such computer programs represent controllers of the computing device 1000.

Embodiments are also directed to computer program products comprising computer code or instructions stored on any computer-readable medium. Such computer program products include hard disk drives, optical disk drives, memory device packages, portable memory sticks, memory cards, and other types of physical storage hardware.

IV. Additional Exemplary Embodiments

A method performed by a microarchitecture modeling tool is described herein. The method includes receiving an execution trace generated based on an execution of a program and a definition of a microarchitecture on which the program was executed; generating a dependency graph based at least on the execution trace and the definition, the dependency graph being a graphical representation of the execution of the program and comprising a plurality of vertices, each vertex of the plurality of vertices representing a microarchitectural event that occurred during execution of the program, each vertex of the plurality of vertices being coupled to at least another vertex of the plurality of vertices via an edge, the edge representing a dependency between the microarchitectural events represented by edge-coupled vertices; associating at least one of each vertex of the plurality of vertices with a microarchitectural event cost for performing a first microarchitectural event represented thereby or each edge of the plurality of edges with a second microarchitectural event represented by at least one vertex of the plurality of vertices coupled thereto; and determining a design metric of the microarchitecture based on an analysis of the microarchitectural event costs associated with at least one of the plurality of vertices or the plurality of edges.

In one embodiment of the foregoing method, the method further comprises: responsive to receiving user input, modifying at least one of the microarchitectural event costs associated with at least one of the plurality of vertices, the microarchitectural event costs associated with at least one of the plurality of edges, at least one of the plurality of vertices, or at least one of the plurality of edges to model a change in the microarchitecture; and determining a second design metric of the microarchitecture based on the modification.

In another embodiment of the foregoing method, of the method further comprises: implementing the modeled change in a hardware-based microarchitecture.

In a further embodiment of the foregoing method, the user input specifies a plurality of microarchitectural event costs for at least one of a particular edge of the plurality of edges or a particular vertex of the plurality of vertices in a vector format.

In yet another embodiment of the foregoing method, said determining the second design metric of the microarchitecture comprises: determining the second design metric of the microarchitecture based on an analysis of the plurality of microarchitectural event costs specified by the user.

In a further embodiment of the foregoing method, the definition of the microarchitecture specifies one or more of: a number of cache ports supported by the microarchitecture; a number of physical registers supported by the microarchitecture; a number of functional units supported by the microarchitecture; a commit bandwidth supported by the microarchitecture; an instruction fetch bandwidth supported by the microarchitecture; a memory bandwidth supported by the microarchitecture; a branch prediction scheme supported by the microarchitecture; one or more pipeline stages and functions thereof supported by the microarchitecture; a data forwarding scheme supported by the microarchitecture; a control flow speculation scheme supported by the microarchitecture; a memory disambiguation scheme supported by the microarchitecture; a communication network supported by the microarchitecture; an instruction window size supported by the microarchitecture; or an instruction issue width supported by the microarchitecture.

In still a further embodiment of the method, the microarchitectural event costs specify at least one of: a latency, one or more gate delays, or power consumption associated with a cache access hit; a latency, one or more gate delays, or power consumption associated with a cache access miss; a latency, one or more gate delays, or power consumption associated with accessing memory; a latency, one or more gate delays, or power consumption associated with decoding an instruction; a latency, one or more gate delays, or power consumption associated with a branch prediction scheme supported by the microarchitecture; a latency, one or more gate delays, or power consumption associated with recovering from a misspeculation of instruction execution; a latency, one or more gate delays, or power consumption associated with one or more execution units of the microarchitecture; or a latency, one or more gate delays, or power consumption associated with network communication.

In yet a further embodiment of the method, the method further comprises: receiving a policy that specifies how the microarchitecture handles a structural hazard thereof, wherein said generating a dependency graph comprises: generating the dependency graph based at least on the execution trace, the definition, and the policy.

In still a further embodiment of the method, the method further comprises: receiving an input that specifies a portion of the execution trace for which the dependency graph is generated, wherein said generating the dependency graph comprises: generating the dependency graph based on the portion of the execution trace and the definition.

A system is also described herein. The system includes at least one processor circuit; and at least one memory that stores program code configured to be executed by the at least one processor circuit, the program code comprising: a microarchitecture modeling tool configured to: receive an execution trace generated based on an execution of a program and a definition of a microarchitecture on which the program was executed; generate a dependency graph based at least on the execution trace and the definition, the dependency graph being a graphical representation of the execution of the program and comprising a plurality of vertices, each vertex of the plurality of vertices representing a microarchitectural event that occurred during execution of the program, each vertex of the plurality of vertices being coupled to at least another vertex of the plurality of vertices via an edge, the edge representing a dependency between the microarchitectural events represented by edge-coupled vertices; associate at least one of each vertex of the plurality of vertices with a microarchitectural event cost for performing a first microarchitectural event represented thereby or each edge of the plurality of edges with a second microarchitectural event represented by at least one vertex of the plurality of vertices coupled thereto; and determine a design metric of the microarchitecture based on an analysis of the microarchitectural event costs associated with at least one of the plurality of vertices or the plurality of edges.

In one embodiment of the system, the microarchitecture modeling tool is further configured to: responsive to receiving user input, modify at least one of the microarchitectural event costs associated with at least one of the plurality of vertices, the microarchitectural event costs associated with at least one of the plurality of edges, at least one of the plurality of vertices, or at least one of the plurality of edges to model a change in the microarchitecture; and determine a second design metric of the microarchitecture based on the modification.

In another embodiment of the system, the modeled change is implemented in a hardware-based microarchitecture.

In still another embodiment of the system, the user input specifies a plurality of microarchitectural event costs for at least one of a particular edge of the plurality of edges or a particular vertex of the plurality of vertices in a vector format.

In another embodiment of the system, the microarchitecture modeling tool is configured to determine the second design metric of the microarchitecture by: determining the second design metric of the microarchitecture based on an analysis of the plurality of microarchitectural event costs specified by the user.

In still another embodiment of the system, the microarchitecture modeling tool is further configured to: receive a policy that specifies how the microarchitecture handles a structural hazard thereof, wherein the microarchitecture modeling tool is configured to generate the dependency graph by: generating the dependency graph based at least on the execution trace, the definition, and the policy.

In yet another embodiment of the system, the microarchitecture modeling tool is further configured to: receiving an input that specifies a portion of the execution trace for which the dependency graph is generated, wherein the microarchitecture modeling is configured to generate the dependency graph by: generating the dependency graph based on the portion of the execution trace and the definition.

A computer-readable storage medium having program instructions recorded thereon that, when executed by at least one processor, perform a method for a microarchitecture modeling tool is further described herein. The method includes receiving an execution trace of a program and a definition of a microarchitecture on which the program was executed; generating a dependency graph based at least on the execution trace and the definition, the dependency graph being a graphical representation of the execution of the program and comprising a plurality of vertices, each vertex of the plurality of vertices representing a microarchitectural event that occurred during execution of the program, each vertex of the plurality of vertices being coupled to at least another vertex of the plurality of vertices via an edge, the edge representing a dependency between the microarchitectural events represented by edge-coupled vertices; associating at least one of each vertex of the plurality of vertices with a microarchitectural event cost for performing a first microarchitectural event represented thereby or each edge of the plurality of edges with a second microarchitectural event represented by at least one vertex of the plurality of vertices coupled thereto; and determining a design metric of the microarchitecture based on an analysis of the microarchitectural event costs associated with at least one of the plurality of vertices or the plurality of edges.

In one embodiment of the foregoing computer-readable storage medium, the method further comprises: responsive to receiving user input, modifying at least one of the microarchitectural event costs associated with at least one of the plurality of vertices, the microarchitectural event costs associated with at least one of the plurality of edges, at least one of the plurality of vertices, or at least one of the plurality of edges to model a change in the microarchitecture; and determining a second design metric of the microarchitecture based on the modification.

In another embodiment of the foregoing computer-readable storage medium, the method further comprises: implementing the modeled change in a hardware-based microarchitecture.

In a further embodiment of the foregoing computer-readable storage medium, the user input specifies a plurality of microarchitectural event costs for at least one of a particular edge of the plurality of edges or a particular vertex of the plurality of vertices in a vector format.

V. Conclusion

While various embodiments have been described above, it should be understood that they have been presented by way of example only, and not limitation. It will be understood by those skilled in the relevant art(s) that various changes in form and details may be made therein without departing from the spirit and scope of the disclosed embodiments as defined in the appended claims. Accordingly, the breadth and scope of the present embodiments should not be limited by any of the above-described exemplary embodiments, but should be defined only in accordance with the following claims and their equivalents.

What is claimed is:
1. A method performed by a computer-implemented microarchitecture modeling tool, comprising:
receiving an execution trace generated based on an execution of a program, a definition of a microarchitecture on which the program was executed, and a policy that specifies how the microarchitecture handles a structural hazard;

generating a dependency graph based at least on the execution trace, the definition and the policy, the dependency graph being a representation of the execution of the program, wherein generating the dependency graph comprises:
  generating a plurality of vertices, each vertex of the plurality of vertices specifying a particular microarchitectural event that occurred during execution of the program,
  generating a plurality of edges, each edge of the plurality of edges coupling a vertex of the plurality of vertices to at least another vertex of the plurality of vertices and representing a dependency between the microarchitectural events specified by edge-coupled vertices, and
  generating at least one edge connecting a plurality of vertices associated with a structural hazard;

associating at least one of each vertex of the plurality of vertices with a microarchitectural event cost for performing a first microarchitectural event specified thereby or each edge of the plurality of edges with a second microarchitectural event specified by at least one vertex of the plurality of vertices coupled thereto;

determining a first design metric of the microarchitecture based on an analysis of the microarchitectural event costs associated with at least one of the plurality of vertices or the plurality of edges; and implementing a change modeled in the microarchitecture via the dependency graph in a hardware-based architecture.

2. The method of claim 1, further comprising:
receiving user input specifying a plurality of microarchitectural event costs for at least one of a particular edge of the plurality of edges or a particular vertex of the plurality of vertices in a vector format.

3. The method of claim 2, further comprising:
determining a second design metric of the microarchitecture based on an analysis of the plurality of microarchitectural event costs specified by the user.

4. The method of claim 1, wherein the definition of the microarchitecture specifies one or more of:
  a number of cache ports supported by the microarchitecture;
  a number of physical registers supported by the microarchitecture;
  a number of functional units supported by the microarchitecture;
  a commit bandwidth supported by the microarchitecture;
  an instruction fetch bandwidth supported by the microarchitecture;
  a memory bandwidth supported by the microarchitecture;
  a branch prediction scheme supported by the microarchitecture;
  one or more pipeline stages and functions thereof supported by the microarchitecture;
  a data forwarding scheme supported by the microarchitecture;
  a control flow speculation scheme supported by the microarchitecture;
  a memory disambiguation scheme supported by the microarchitecture;
  a communication network supported by the microarchitecture;
  an instruction window size supported by the microarchitecture; or
  an instruction issue width supported by the microarchitecture.

5. The method of claim 1, wherein the microarchitectural event costs specify at least one of:
  a latency, one or more gate delays, or power consumption associated with a cache access hit;
  a latency, one or more gate delays, or power consumption associated with a cache access miss;
  a latency, one or more gate delays, or power consumption associated with accessing memory;
  a latency, one or more gate delays, or power consumption associated with decoding an instruction;
  a latency, one or more gate delays, or power consumption associated with a branch prediction scheme supported by the microarchitecture;
  a latency, one or more gate delays, or power consumption associated with recovering from a misspeculation of instruction execution;
  a latency, one or more gate delays, or power consumption associated with one or more execution units of the microarchitecture; or
  a latency, one or more gate delays, or power consumption associated with network communication.

6. The method of claim 1, further comprising:
receiving an input that specifies a portion of the execution trace for which the dependency graph is generated, wherein said generating the dependency graph comprises:
generating the dependency graph based on the portion of the execution trace and the definition.

7. The method of claim 1, wherein the definition of the microarchitecture is received by the microarchitecture modeling tool as a text-based file.

8. The method of claim 1, further comprising:
receiving user input modifying the microarchitectural event costs associated with at least one of the plurality of edges to model a change in the microarchitecture;
determining a second design metric of the microarchitecture based on the modification; and
displaying the determined second design metric to the user.

9. A system, comprising:
at least one processor circuit; and
at least one memory that stores program code configured to be executed by the at least one processor circuit, the program code comprising:
a microarchitecture modeling tool configured to:
  receive an execution trace generated based on an execution of a program and a definition of a microarchitecture on which the program was executed;
  generate a dependency graph based at least on the execution trace and the definition, the dependency graph being a graphical representation of the execution of the program and comprising a plurality of vertices, each vertex of the plurality of vertices specifying a particular microarchitectural event that occurred during execution of the program, each vertex of the plurality of vertices being coupled to at least another vertex of the plurality of vertices via an edge, the edge representing a dependency between the microarchitectural events specified by edge-coupled vertices;
  associate each vertex of the plurality of vertices with a microarchitectural event cost for performing a first microarchitectural event specified thereby, and at least one of the plurality of edges with a microarchitectural event cost;
determine a first design metric of the microarchitecture based on an analysis of the microarchitectural event costs associated with at least one of the plurality of vertices or the plurality of edges;
receive user input modifying the microarchitectural event costs associated with at least one of the plurality of edges to model a change in the microarchitecture;
determine a second design metric of the microarchitecture based on the modification; and
display the determined second design metric to the user, the change being modeled in the microarchitecture via the dependency graph being implemented in a hardware-based architecture.

10. The system of claim 9, wherein the user input specifies a plurality of microarchitectural event costs for at least one of a particular edge of the plurality of edges or a particular vertex of the plurality of vertices in a vector format.

11. The system of claim 10, wherein the microarchitecture modeling tool is configured to determine the second design metric of the microarchitecture by:
determining the second design metric of the microarchitecture based on an analysis of the plurality of microarchitectural event costs specified by the user.

12. The system of claim 9, wherein the microarchitecture modeling tool is further configured to:
receive a policy that specifies how the microarchitecture handles a structural hazard thereof; and
generate the dependency graph based at least on the execution trace, the definition, and the policy.

13. The system of claim 9, wherein the microarchitecture modeling tool is further configured to:
receive an input that specifies a portion of the execution trace for which the dependency graph is generated; and
generate the dependency graph based on the portion of the execution trace and the definition.

14. A computer-readable storage medium having program instructions recorded thereon that, when executed by at least one processor, perform a method for a microarchitecture modeling tool, the method comprising:
receiving an execution trace generated based on an execution of a program and a definition of a microarchitecture on which the program was executed;
generating a dependency graph based at least on the execution trace and the definition, the dependency graph being a graphical representation of the execution of the program and comprising a plurality of vertices, each vertex of the plurality of vertices specifying a particular microarchitectural event that occurred during execution of the program, each vertex of the plurality of vertices being coupled to at least another vertex of the plurality of vertices via an edge, the edge representing a dependency between the microarchitectural events specified by edge-coupled vertices;
associating each vertex of the plurality of vertices with a microarchitectural event cost for performing a first microarchitectural event specified thereby, and at least one of the plurality of edges with a microarchitectural event cost; and
determining a first design metric of the microarchitecture based on an analysis of the microarchitectural event costs associated with at least one of the plurality of vertices or the plurality of edges;
receiving user input modifying the microarchitectural event costs associated with at least one of the plurality of edges to model a change in the microarchitecture;
determining a second design metric of the microarchitecture based on the modification;
displaying the determined second design metric to the user, the change modeled in the microarchitecture via the dependency graph being implemented in a hardware-based architecture.

15. The computer-readable storage medium of claim 14, wherein the user input specifies a plurality of microarchitectural event costs for at least one of a particular edge of the plurality of edges or a particular vertex of the plurality of vertices in a vector format.

16. The computer-readable storage medium of claim 15, wherein said determining the second design metric of the microarchitecture comprises:
determining the second design metric of the microarchitecture based on an analysis of the plurality of microarchitectural event costs specified by the user.

17. The computer-readable storage medium of claim 14, wherein the definition of the microarchitecture specifies one or more of:
a number of cache ports supported by the microarchitecture;
a number of physical registers supported by the microarchitecture;
a number of functional units supported by the microarchitecture;
a commit bandwidth supported by the microarchitecture;
an instruction fetch bandwidth supported by the microarchitecture;
a memory bandwidth supported by the microarchitecture;
a branch prediction scheme supported by the microarchitecture;
one or more pipeline stages and functions thereof supported by the microarchitecture;
a data forwarding scheme supported by the microarchitecture;
a control flow speculation scheme supported by the microarchitecture;
a memory disambiguation scheme supported by the microarchitecture;
a communication network supported by the microarchitecture;
an instruction window size supported by the microarchitecture; or
an instruction issue width supported by the microarchitecture.

18. The computer-readable storage medium of claim 14, wherein the microarchitectural event costs specify at least one of:
a latency, one or more gate delays, or power consumption associated with a cache access hit;
a latency, one or more gate delays, or power consumption associated with a cache access miss;
a latency, one or more gate delays, or power consumption associated with accessing memory;
a latency, one or more gate delays, or power consumption associated with decoding an instruction;
a latency, one or more gate delays, or power consumption associated with a branch prediction scheme supported by the microarchitecture;
a latency, one or more gate delays, or power consumption associated with recovering from a misspeculation of instruction execution;

a latency, one or more gate delays, or power consumption associated with one or more execution units of the microarchitecture; or a latency, one or more gate delays, or power consumption associated with network communication.

19. The computer-readable storage medium of claim 14, the method further comprising:

receiving a policy that specifies how the microarchitecture handles a structural hazard thereof, wherein said generating a dependency graph comprises:

generating the dependency graph based at least on the execution trace, the definition, and the policy.

20. The computer-readable storage medium of claim 14, the method further comprising:

receiving an input that specifies a portion of the execution trace for which the dependency graph is generated, wherein said generating the dependency graph comprises:

generating the dependency graph based on the portion of the execution trace and the definition.

* * * * *